US006713851B1

(12) United States Patent
Umehara et al.

(10) Patent No.: US 6,713,851 B1
(45) Date of Patent: Mar. 30, 2004

(54) LEAD OVER CHIP SEMICONDUCTOR DEVICE INCLUDING A HEAT SINK FOR HEAT DISSIPATION

(75) Inventors: Norito Umehara, Ibaraki (JP); Masazumi Amagai, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/388,678

(22) Filed: Sep. 2, 1999

(30) Foreign Application Priority Data

Sep. 2, 1998 (JP) .......................... 10-248136

(51) Int. Cl.[7] .......................... H01L 23/495
(52) U.S. Cl. .................. 257/675; 257/707; 257/713; 257/717; 257/720; 361/702; 361/709; 361/711; 361/723; 361/813
(58) Field of Search .............................. 257/669, 672, 257/675, 676, 706, 707, 712, 720, 666, 713, 717, 784; 361/702, 709, 711, 723, 813, 704

(56) References Cited

U.S. PATENT DOCUMENTS 5,266,834 A * 11/1993 Hishi et al. ................. 257/706
5,438,478 A * 8/1995 Kondo et al. ................ 361/704
6,208,023 B1 * 3/2001 Nakayama et al. .......... 257/696
6,307,755 B1 * 10/2001 Williams et al. ............ 361/813

FOREIGN PATENT DOCUMENTS

| JP | 8-255853 | * 10/1986 |
| JP | 63-273341 | * 11/1988 |
| JP | 3-237747 | * 10/1991 |
| JP | 4-91458 | * 3/1992 |
| JP | 4-114455 | * 4/1992 |
| JP | 7-153871 | * 6/1995 |

* cited by examiner

Primary Examiner—Kamand Cuneo
Assistant Examiner—Alonzo Chambliss
(74) Attorney, Agent, or Firm—Michael K. Skrehot; W. James Brady, III; Frederick J. Telecky, Jr.

(57) ABSTRACT

The invention relates to an LOC type semiconductor device having improved heat radiation. The semiconductor device related to the present invention has a preferably metal heat-radiating element 7 that is in thermal contact with the surface opposite the principal surface of the semiconductor chip 3. One region of said heat-radiating element 7 is externally exposed from the package that encloses the semiconductor chip 3. The heat-radiating element 7 is in thermal contact with a metal pattern 12 that is formed on the substrate 10 on which the semiconductor device is mounted. The heat from the semiconductor chip is transferred to the mounting substrate 10 side via the heat-radiating plate 7, and heat dissipation is conducted efficiently.

17 Claims, 3 Drawing Sheets

LEAD OVER CHIP SEMICONDUCTOR DEVICE INCLUDING A HEAT SINK FOR HEAT DISSIPATION

FIELD OF THE INVENTION

The present invention relates to a package design for an LOC type semiconductor device, and specifically, it relates to a package design for an LOC type semiconductor device that has superior heat dissipation properties.

BACKGROUND OF THE INVENTION

By means of developing miniaturized processing technology, a path is being pursued wherein the number of elements that can be integrated in a single semiconductor integrated circuit device has increased. According to current 0.35–0.18 µm layout rules, the mounting of roughly several million transistors within a semiconductor chip several tens of mm square is possible. The increase in the number of transistors per unit surface area brings about a change to high-speed, high-performance semiconductor devices, and large-capacity semiconductor memory.

On the other hand, since each transistor in the semiconductor chip radiates heat, when the integration level is increased, the problems of heat generation become more serious. The heat within the semiconductor chip influences the movement of electrons within it and there are instances when erroneous operation of the semiconductor chip occurs.

LOC (Lead On Chip) is a package design that is equipped with a lead frame that is formed on the principal surface of the semiconductor chip, in other words, the surface on which circuit elements and electrode pads are formed, and is mainly used in semiconductor memory devices. In the LOC package, most of the region for the semiconductor chip and lead frame is covered by means of resin or other package material. The package material fulfills an important protects the semiconductor chip from contaminated air, but, on the other hand, creates the problem that the heat from the semiconductor chip will be sealed in and that the possibility of erroneous operation of the above-mentioned semiconductor device will increase. In a semiconductor memory device, the power consumption in current 64 MB DRAM (Dynamic Random -Access Memory) is about 300 mW, and the thermal resistance is about 60$_E$C/W. In the 256 MB synchronous DRAM of the next generation, it is assumed that the power consumption will increase to about 2 W, and the problem of heat dissipation is thus expected to be one order of magnitude greater.

Against this background, the combined efforts for the purpose of externally releasing the heat that is generated by the semiconductor chip are continuing. One solution requires a heat sink, a metal plate with multiple ribs, to be installed on the upper portion of the package material. However, since the already existing packaging material is present in between the semiconductor chip and the heat sink, and efficiently pulls down the internal thermal resistance, the heat sink must be greatly changed. In fulfilling the requirements for the miniaturization of the electronic equipment in which the semiconductor device is mounted, the presence of the heat sink becomes a great problem.

Also, the construction wherein one portion of the semiconductor chip such as one portion of the CSP (Chip Size Package) is exposed outside the package material is extremely effective in lowering the internal heat resistance. However, since the integration level of the semiconductor device will continue to rise, a means of further improving the heat radiating efficiency becomes important.

The purpose of the present invention is to offer a package design for an a LOC type semiconductor device that can dissipate a greater amount of heat than current designs.

Another purpose of the present invention is to improve thermal dissipation without increasing the size of the package.

SUMMARY OF THE INVENTION

The present invention relates to a package design for an LOC type semiconductor device that has a superior thermal dissipation. The semiconductor device of the present invention has a preferably metal heat-radiating element that is in thermal contact with the surface opposite the principal surface of the semiconductor chip. One area of said heat-radiating element is externally exposed from the package material enclosing the semiconductor chip. As a result, the heat generated in the semiconductor chip is efficiently transferred to the above-mentioned heat-radiating element, and is further externally discharged from said exposed region.

Here, the above-mentioned heat-radiating element is exposed on the bottom of the semiconductor device, and preferably, it is in thermal contact with the substrate on which the semiconductor device is mounted, preferably, with a metal pattern formed thereon. The heat from the semiconductor chip is transferred to the mounting substrate and is more efficiently dissipated.

The present invention also offers a semiconductor device manufacturing method that is equipped with the above-mentioned heat-radiating element. In other words, its manufacturing method includes a process for forming on the surface opposite to the principal surface of the semiconductor chip an element for adhering heat-radiating element with which the heat from said semiconductor chip can externally escape, a process for arranging, on the principal surface of the above-mentioned semiconductor chip, multiple conductive leads that extend outward for the purpose of connecting one of the ends of each lead to an external section and electrically connecting each of the other ends of the above-mentioned conductive leads to the above-mentioned semiconductor chip, and a process for sealing the above-mentioned semiconductor chip by means of a package element in a configuration in which one portion of the above-mentioned heat-radiating element is externally exposed.

Here, the process for forming an element with which the heat-radiating element is adhered to the above-mentioned semiconductor chip includes a process for adhering a heat-radiating material on one surface of the semiconductor wafer and a process for cutting the above-mentioned heat radiating material along with the above-mentioned semiconductor wafer to the dimensions of the semiconductor chip.

REFERENCE NUMERALS AND SYMBOLS AS SEEN IN THE DRAWINGS

Figure 1:
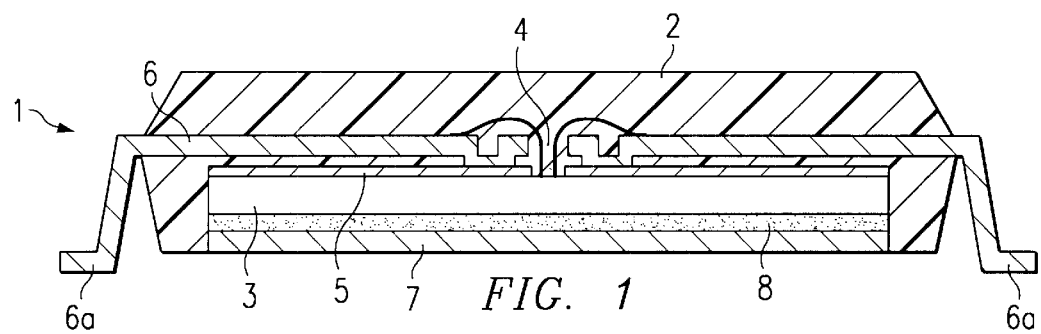
FIG. 1 is a cross-sectional view showing one embodiment configuration in which the present invention is applied to a center bond LOC type semiconductor device.

In the drawings, 1 represents a memory device, 2 a package element, 3 a semiconductor chip, 4 an electrode pad, 5 a protective film, 6 a lead frame, 6a a conductive lead, 7 a heat-radiating plate, 8 an adhesive layer, 10 a printed-circuit board, 11 a wiring pattern, 12 a rectangular pattern, and 13 a solder.

DESCRIPTION OF EMBODIMENTS

A embodiment of this present invention will be explained below with reference to the figures. In this embodiment, an example is shown that is applied to a 256 MB DRAM having the center bond LOC design of the present invention. However, the present invention is not limited to this type of semiconductor device; it is also applicable to LSI device, such as microprocessors or DSP, (Digital Signal Processor), analog LSI device, and other semiconductor devices.

As shown in FIG. 1, the memory device 1 containing the semiconductor chip 3 that is covered by the package material 2. As for the semiconductor chip 3, the electrode pads 4 are provided in one central row on its principal surface, and the principal surface, except said row of electrode pads 4, is covered with a protective film 5. The lead frame 6 is arranged on top of the principal surface of the semiconductor chip 3. The lead frame 6, on either side of the row of the above-mentioned electrode pads 4, offers multiple conductive leads 6a for the purpose of electrically connecting the semiconductor chip 3 to an external substrate. One end of each conductive lead 6a (inner lead) toward the electrode pad 4 is wire bonded to the corresponding electrode pad 4, and the other end (outer lead) extends out to an outer section from the side of the package material 2, and is bent so that the device can be mounted on an external substrate.

The memory device 1 also has the heat-radiating plate 7 on the lower surface of the above-mentioned semiconductor chip. The lower surface of the heat-radiating plate 7 is exposed on the lower surface of the package material 2, and forms part of the external package of the memory device 1. The heat-radiating plate 7 has the same planar dimensions as the dimensions of the semiconductor chip 3, and is glued to the lower surface of the semiconductor chip 3 by means of the adhesive layer 8, preferably a thermoplastic polyimide resin. The heat-radiating plate 7 is supplied at the time of supplying the semiconductor chip 3, but this method is explained later.

Figure 2:
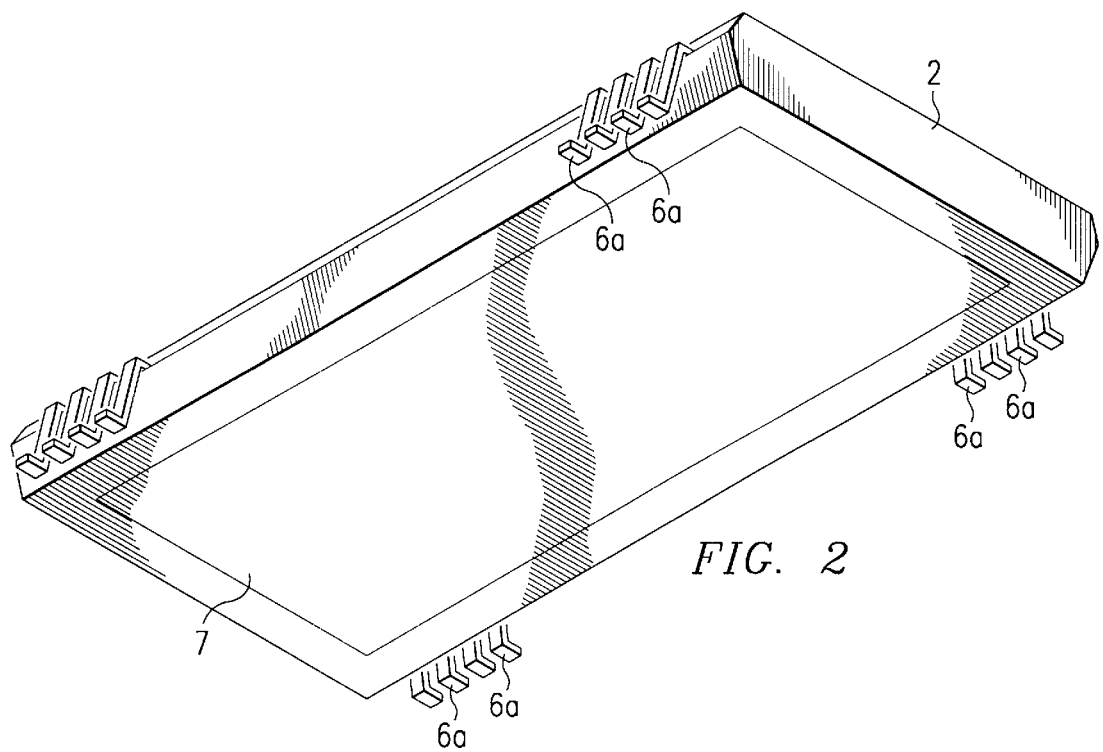
FIG. 2 is an oblique view of the semiconductor device of FIG. 1 as seen from below.

FIG. 2 is an oblique view of the memory device 1 as seen from the bottom. The figure shows that the above-mentioned heat-radiating plate 7 is exposed at the bottom surface of the memory device 1. In the embodiment shown in the figure, the bottom surface of the memory device 1 formed by the heat-radiating plate 7 and the bottom surface formed by the package element 2 surrounding it are the same plane and are contiguous. However, in the present invention, the surface of the heat-radiating plate 7 may also be above or below the plane of the package material 2; it need only be externally exposed.

Figure 3:
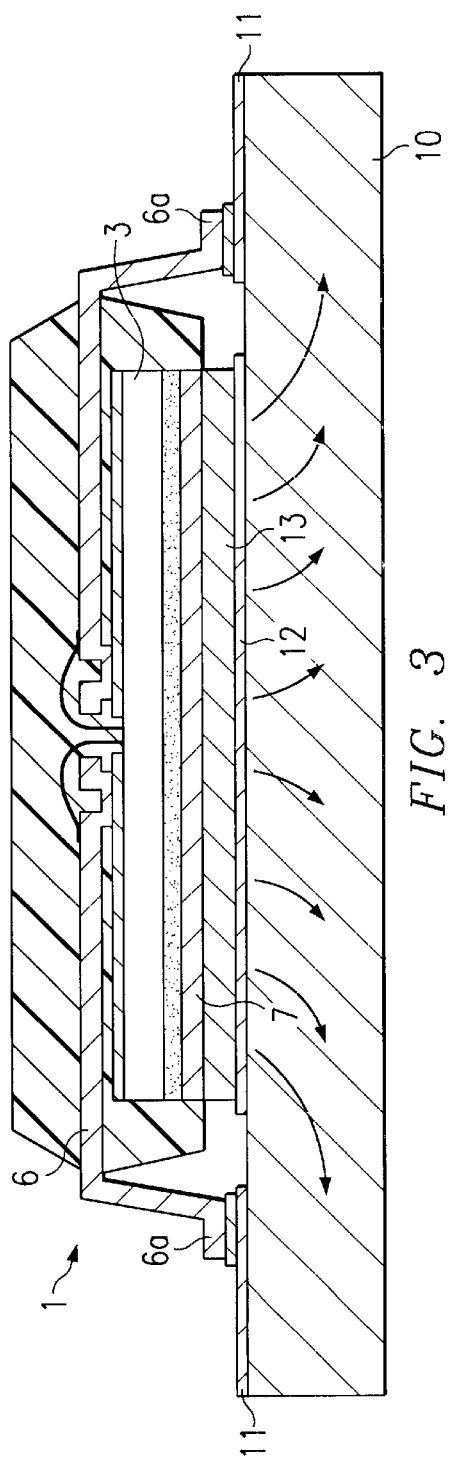
FIG. 3 is a cross-sectional view showing a mounting configuration of the semiconductor device of FIG. 1 to a printed-circuit board.
Figure 4A:
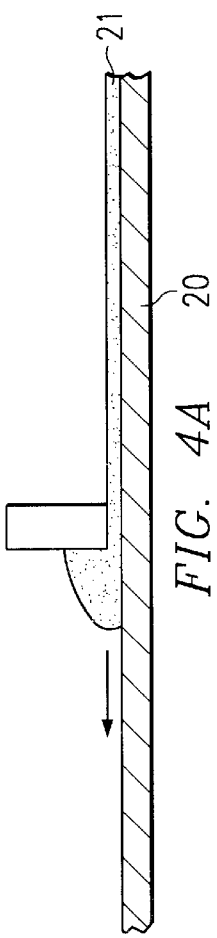
FIGS. 4A–G are diagrams showing the manufacturing processes for the semiconductor device of FIG. 1.
Figure 4B:
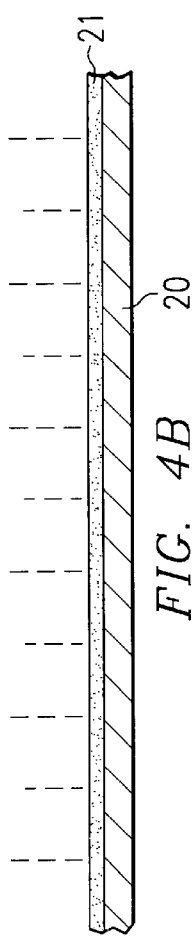
Figure 4C:
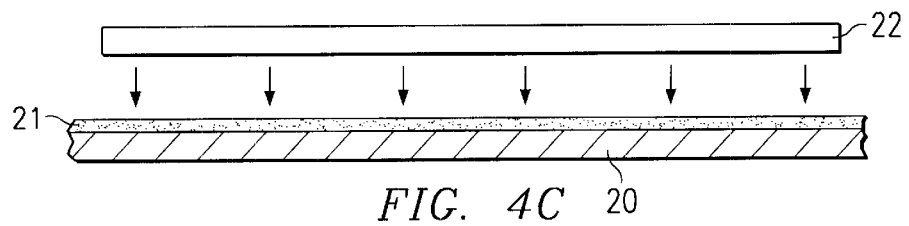
Figure 4D:
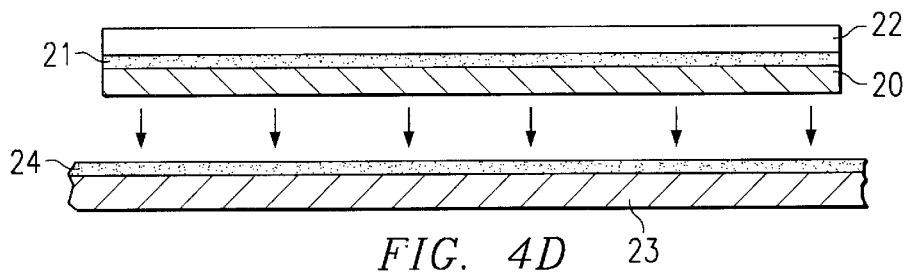
Figure 4E:
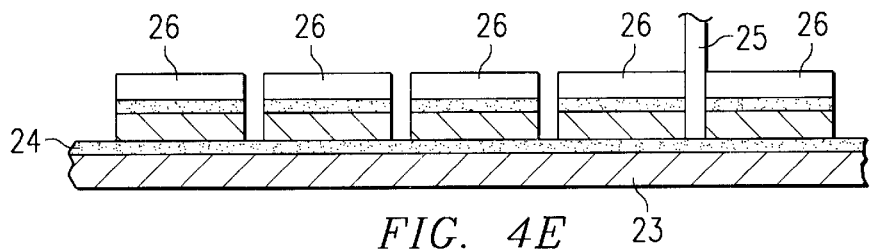
Figure 4F:
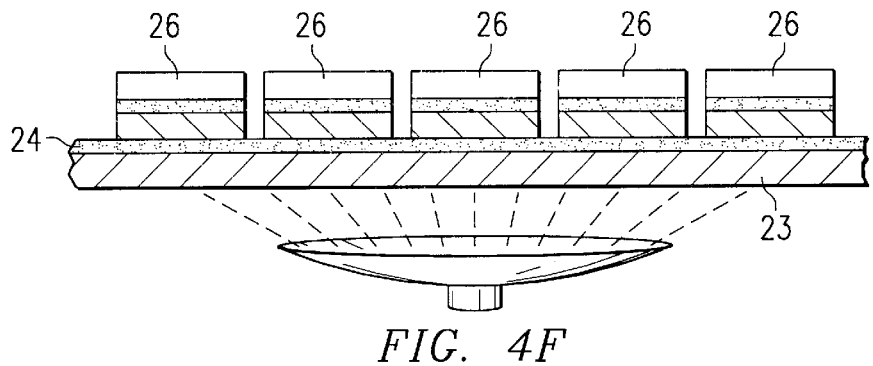
Figure 4G:
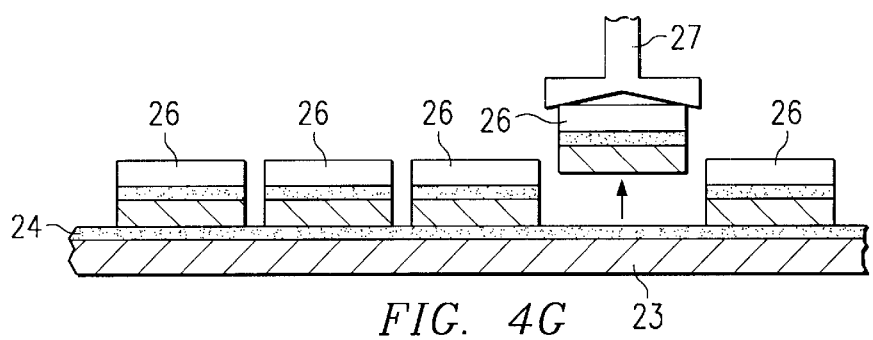

FIG. 3 shows the appearance of the above-mentioned memory device 1 when it is mounted on a printed-circuit board 10. On top of the printed-circuit board 10, a wiring pattern 11 is provided for connecting the memory device 1 to other electronic devices and for supplying electrical power to the memory device 1. One end of each wiring pattern is aligned corresponding to the alignment of the conductive leads 6a of the memory device 1, and each conductive lead 6a is soldered thereon. On top of the printed-circuit board 10, the square pattern 12 corresponding to the size of the above-mentioned heat radiating pad 7 is also formed in the mounting position for the memory device 1, i.e., in the region that is enclosed by means of one end of the above-mentioned wiring pattern 11.

The heat-radiating plate 7 of the memory device 1 is in thermal contact with the above-mentioned rectangular pattern 12 by means of the solder 13. As a result, the semiconductor chip 3 is connected to the rectangular pattern 12 by means of the heat-radiating plate 7, and thus, is in thermal contact with the printed-circuit board 10 itself; the aforementioned head-radiating plate 7, rectangular pattern 12, and printed-circuit board 10 act as a heat sink for the semiconductor chip. In FIG. 3, the pattern with which the heat from the semiconductor chip flows across the printed-circuit board 10 and is dissipated is indicated by the arrows.

Here, it is necessary that the heat-radiating plate 7 be thermally connected to the printed-circuit board 10 side, and thus, it is not absolutely necessary that solder be used to connect the heat-radiating plate 7 to the printed-circuit board. However, if solder is used to connect the conductive leads 6a to the wiring pattern 11, there is the advantage that the above-mentioned connection of the heat-radiating plate 7 to the rectangular pattern 12 can be performed at the same time as connecting the conductive leads by means of batch reflow. As long as it is related to the thermal connecting of the heat-radiating plate 7, a method can also be used wherein the heat-radiating plate 7 is connected by using an adhesive directly on the surface of the printed-circuit board without providing the rectangular pattern 12.

As was explained above, the heat-radiating plate 7 is an element that absorbs the heat emitted from the semiconductor chip 3 and radiates it outside the package. A material with high thermal conductivity, for example, a metal such as copper or iron, or an alloy thereof, can be used for this purpose. In order to enhance the bonding by means of the above-mentioned solder, palladium plating or solder plating can be executed on the exposed surface of the heat-radiating plate 7. The heat-radiating plate 7 can be as thin as possible in a range in which solder bonding is possible, preferably, from 5 $\mu$m to 125 $\mu$m. Also, the thickness of the above-mentioned adhesive layer 8, should be 50 $\mu$m or less from the aspect of residual solvent and reliability, and preferably, from 5 $\mu$m to 30 $\mu$m.

Next, an explanation is given in regard to the manufacturing method for the above-mentioned memory device. In FIG. 4, a process is shown that takes out a semiconductor chip from a wafer. In this process, a metal plate that becomes the base of the heat-radiating plate is bonded to the wafer and is diced, along with the wafer, and attention should be paid to the point at which it is supplied. In the following explanation, the above-mentioned metal plate is called the heat-radiating plate without distinguishing it from the heat radiating plate that is used after cutting.

The initial process forms the adhesive layer 21 of a thermoplastic polyimide on top of the heat-radiating plate 20. In other words, it is a process in which a thermoplastic polyimide varnish is applied to the surface of the heat-radiating plate 20, which is supplied in sheet form by means of a coater or by a screen-printing (process (A)). the coated plate is heated, and by removing the solvent form the varnish, the adhesive layer 21 is obtained (process (B)). There is also a method in which the above-mentioned adhesive layer 21 can be obtained by coating polyamide as a polyimide precursor, and it is evaporated in a thermal environment at the time of the solvent removal. However, since evaporation is conducted at a high temperature of 200$_E$C or more, it is necessary to consider the influence due to the oxidation and the thermal expansion of the heat-radiating plate. Also, as for the solvent that is used for the purpose of dissolving the above-mentioned thermoplastic polyimide, one with a low boiling point is desirable, and specifically, cylcopentanone (boiling point: 130$_E$C), cyclohexanone (boiling point: 157$_E$C), N,N-dimethyl formamide (boiling point: 165$_E$C), and the like, are good. Also, in order to lower the water absorption coefficient of the above-mentioned thermoplastic polyimide and improve the anti-reflow characteristics of the package, it is desirable that fluoride denaturation be conducted.

Next, the ambient temperature is raised to about 150$_E$C, the adhesive layer 21 is heated and melts and the semiconductor wafer 22 is placed on top of the adhesive layer. The adhesive layer 21 is cooled at room temperature, and the semiconductor wafer 22 is adhered on top of the heat-radiating plate 20 (process (C)). The heat-radiating plate 20 is then cut to approximately the same size as the semiconductor wafer 22. Next, a dicing tape 23 is prepared wherein a UV-curable hardening adhesive 24 is coated on a base tape, and the heat-radiating plate 20 to which the above-mentioned semiconductor wafer 22 is adhered is bonded to said adhesive material 24 (process (D)).

The dicing blade 25 is used to dice the semiconductor wafer 22 and the heat-radiating plate 20 on top of said dicing tape 23 into units for the individual semiconductor chips 26 (process (E)). UV radiation then irradiates the dicing tape 23, and since the adhesive material 24 is hardened, peeling at the boundary of the adhesive material 24 and the heat-radiating plate 20 is simplified do (process (F)). Finally, the individual semiconductor chips 26 are picked up by using the collet 27 and are supplied to the assembly process for the semiconductor device (process (G)). In this manner, the mass production of the semiconductor chips 26 with heat-radiating plates becomes possible. Because the heat-radiating plate is diced along with the semiconductor chip as explained above, the preparation of a heat-radiating plate that matches the dimensions of each semiconductor chip is not necessary.

The use of a dual dicer is suitable for cutting the above-mentioned semiconductor wafer 22 and the metal heat-radiating plate 20, A dual dicer is equipped with two spindles, different types of blades are attached to each spindle, and it is possible to conduct processes at the same time with these blades. In other words, initially, the semiconductor wafer 22 is cut by means of the first blade used for cutting silicon, and following this, the heat-radiating plate 20 can be cut by means of the second blade used for cutting metal.

In the assembly process for the semiconductor device (refer to FIG. 1), the lead frame 6 is fixed to the top of the semiconductor chip 3 with the heat-radiating plate by using an adhesive tape. Each inner lead of the lead frame 6 is wire-bonded to each electrode pad 4 on the semiconductor chip 3. The semiconductor chip 3 and the lead frame 6 are resin sealed by means of a transfer mold process, except for the external portion of the leads of the lead frame. At this time, the surface of the heat-radiating plate 7 pressure contacts the inner surface of the mold, and the heat-radiating plate 7 is arranged so that it is exposed on the outer surface of the package. Next, the surface of the heat-radiating plate 7 is cleaned, and the resin film on top of the heat-radiating plate 7 is removed. Finally, trimming and forming of the lead frame 6 is conducted, and the memory device 1 shown in FIG. 1 and FIG. 3 is obtained. The mounting of the memory device 1 on a printed-circuit board is as is shown by the previous explanation of FIG. 3.

The inventors of the present invention investigated the problem of cracking of the wafer that may occur as a result of sending the heat-radiating plate 20 to the above-mentioned wafer 22. Because the process bonding is conducted at a high temperature of about 150$_E$C, there is the possibility that the stress that originates from the difference in the linear expansion coefficients of the wafer 22 and the heat-radiating plate 20 when they are cooled at room temperature during the above-mentioned process (C) will cause cracking of the wafer. In order to investigate this problem, the cracking of the wafer was evaluated under the following conditions. The bonding temperature of the wafer and the heat-radiating plate was 150$_E$C, and after that they were left at room temperature (about 25$_E$C).

TABLE I

| Element | Material | Thickness [mm] |
| --- | --- | --- |
| Wafer | 6-in silicon | 0.25 |
| Heat-radiating plate | Copper | 0.1 and 0.15 |
| Adhesive layer | Thermoplastic polyimide | 0.015 |

As a results, in a device in which a copper plate of 0.1-mm thickness was bonded, cracks were not generated in the wafer, but in a device 0.15 mm thick, cracks did appear in some wafers. Thus, it was concluded that if a copper plate is used as the heat radiating plate it is best that the thickness be held at about 0.1 mm. Of course, if a metal is used as the heat-radiating plate whose linear expansion coefficient is close to that of the silicon wafer, for example, 42 alloy, since the stress applied to the wafer will be small, a heat-radiating plate with a thickness of 0.15 mm or more can be used.

An embodiment of the present invention was explained above with reference to the figures. However, the scope of the present invention is not limited to the above-mentioned embodiment but modification can be made within the scope of the patent claims. In the above-mentioned embodiment a thermoplastic polyimide resin was used as the material for adhering the heat-radiating plate to the semiconductor chip, but an epoxy resin can also be used at the B stage or before reaction. In the present invention the electrode pads that are formed along both sides of the chip are well bonded, but a side bond type of LOC package can also be used. It is also not absolutely necessary that the heat-radiating plate have the same dimensions as the semiconductor chip, it can be smaller or larger than the chip, and it can also be a device in which multiple of radiating plates are separately arranged beneath the semiconductor chip. Also, the heat-radiating plate need not be exposed at the bottom surface of the package, but it can also be designed to be exposed at the sides.

By means of the present invention, the heat radiating properties of an LOC type semiconductor device can be improved, and its thermal resistance made smaller. The present invention was applied to a package of conventional design with a thermal resistance of 37$_E$C/W, the thermal resistance was lowered to 27.5$_E$C/W (an improvement of about 25%).

Also, there is no need to provide a cooling device on the outside of the package, and miniaturization of the device is achieved.

Finally, in a manufacturing method for a semiconductor device that supplies the above-mentioned heat-radiating plate along with the semiconductor chip, since it is not necessary to prepare a large variety of semiconductor heat-radiating plates matched to the dimensions of the semiconductor chips and the number of manufacturing processes can be held to a minimum, a semiconductor device that is equipped with this type of heat-radiating plate can be easily mass-produced.

What is claimed is:

1. A lead-on-chip (LOC) semiconductor device comprising:
   a semiconductor chip having first and second major surfaces, an integrated circuit being formed on said first major surface;
   a plurality of conductive leads connected to bond pads on said integrated circuit and extending outward therefrom, said leads being mounted on said first major surface;
   a metallic element having first and second major surfaces, said first major surface of said metallic element attached to said second major surface of said semiconductor chip, said metallic element transferring heat generated by said integrated circuit to an exterior of said device, wherein the metallic element has substantially the same planar dimensions as the dimension of the semiconductor chip; and
   an encapsulant covering said chip and a portion of said metallic element to form a package for said device, said second major surface of said metallic element not being covered by said encapsulant.

2. The LOC device of claim 1 wherein said metallic element is copper.

3. The LOC device of claim 2 wherein said copper element is less than substantially 0.15 mm in thickness.

4. The LOC device of claim 3 wherein said copper element is not more than substantially 0.1 mm in thickness.

5. The LOC device of claim 4 wherein said metal element is soldered to said metal pattern.

6. The LOC device of claim 3 wherein said metal element is soldered to said metal pattern.

7. The LOC device of claim 2 wherein said metal element is soldered to said metal pattern.

8. The LOC device of claim 1 wherein said metallic element is made of 42 alloy.

9. The LOC device of claim 8 wherein said metal element is soldered to said metal pattern.

10. The LOC device of claim 1 wherein said metallic element is a metal plate.

11. The LOC device of claim 10 wherein said metal plate is adhered to said chip by an adhesive layer.

12. The LOC device of claim 11 wherein said metal element is soldered to said metal pattern.

13. The LOC device of claim 10 wherein said metal element is soldered to said metal pattern.

14. The LOC device of claim 1 wherein said metallic element conforms to a shape of said LOC device.

15. The LOC device of claim 14 wherein said metal element is soldered to said metal pattern.

16. The LOC device of claim 1 wherein said metal element is for being adhered to a metal pattern on a printed circuit board.

17. The LOC device of claim 16 wherein said metal element is soldered to said metal pattern.

* * * * *